(12) United States Patent
Chang

(10) Patent No.: US 6,541,322 B2
(45) Date of Patent: Apr. 1, 2003

(54) METHOD FOR PREVENTING GATE DEPLETION EFFECTS OF MOS TRANSISTOR

(75) Inventor: Kent Kuohua Chang, Taipei (TW)

(73) Assignee: Macronix International Co. Ltd., Hsin-Chu (TW)

(*) Notice: Subject to any disclaimer, the term of this patent is extended or adjusted under 35 U.S.C. 154(b) by 13 days.

(21) Appl. No.: 09/858,512

(22) Filed: May 17, 2001

(65) Prior Publication Data

US 2002/0173104 A1 Nov. 21, 2002

(51) Int. Cl.$^7$ .................................. H01L 21/8238
(52) U.S. Cl. ........................... 438/199; 438/279
(58) Field of Search ................... 438/199, 300, 438/279

(56) References Cited

U.S. PATENT DOCUMENTS 4,521,794 A * 6/1985 Murase et al. ................. 257/63
5,168,072 A * 12/1992 Moslehi ....................... 438/300
6,281,559 B1 * 8/2001 Yu et al. ....................... 257/407

OTHER PUBLICATIONS

Wolf, S., Tauber R.N.; Silicon Processing for the VLSI Era vol. 1: Process Technology, Lattice Press, Sunset Beach, CA, 1986, pp. 323–324.*

* cited by examiner

Primary Examiner—John F. Niebling
Assistant Examiner—Christopher Lattin
(74) Attorney, Agent, or Firm—Winston Hsu

(57) ABSTRACT

The present invention shows a method of fabricating a MOS transistor on the substrate of a semiconductor wafer and of preventing the gate depletion effects occurring in the MOS transistor. The method involves first forming a silicon oxide layer on the substrate. Then an amorphous silicon layer is formed on the silicon oxide layer followed by forming a silicon germanium ($Si_{1-x}Ge_x$, x=0.05~1.0) layer on the amorphous silicon layer. Thereafter, an etching process removes portions of the silicon germanium layer and the amorphous silicon layer so as to form gates of the MOS transistor on the substrate. Finally, a spacer is formed around each gate and a source and a drain of each MOS transistor is formed in the substrate.

8 Claims, 4 Drawing Sheets

METHOD FOR PREVENTING GATE DEPLETION EFFECTS OF MOS TRANSISTOR

BACKGROUND OF THE INVENTION

1. Field of the Invention

The present invention relates to a method of forming a metal-oxide semiconductor (MOS) transistor, and more particularly, to a method of preventing gate depletion effects occurring in the MOS transistor.

2. Description of the Prior Art

With the development of very large scale integration (VLSI), the low electricity consumption and high integration of metal-oxide-semiconductor (MOS) transistors allows them to be widely applied in the semiconductor process. Usually, a MOS transistor comprises a gate and two semiconductor regions, called a source and drain located on each side of a capacitor with an electrical characteristic opposite to that of the silicon substrate. The major structure of the gate is composed of a gate oxide layer and a gate conductive layer. When a proper bias is added to the gate, the MOS transistor can be regarded as a solid switch to control the connection of current.

Please refer to FIG. 1 to FIG. 4. FIG. 1 to FIG. 4 are schematic diagrams of fabricating a MOS transistor according to the prior art. As shown in FIG. 1, a semiconductor wafer 10 comprises a silicon substrate 12 and plurality of both field oxides 14 and channel stops 16. In the prior art, the fabricating technique of the MOS transistor first involves placing the semiconductor wafer 10 in a furnace, followed by injecting oxygen into at atmospheric pressure. Thus, by using dry oxidation, the single crystal silicon on the surface of the active area is oxidized to become a silicon oxide layer 18 with a thickness of 100–250 angstroms. The silicon oxide layer 18 is used as a gate oxide.

A low-pressure CVD (LPCVD) process is then performed to deposit an undoped polysilicon layer 20, with a thickness of 1000–2000 angstroms, on the surface of semiconductor wafer 10 to function as a gate conductive layer. After the formation of the undoped polysilicon layer 20, a patterned photoresist layer 22 is formed on the surface of the undoped polysilicon layer 20 to define the pattern and the position of a gate. As shown in FIG. 2, the pattern of the photoresist layer 22 is used as a hardmask to perform an anisotropic etching process to remove both the undoped polysilicon layer 20 and the silicon oxide layer 18 uncovered by the hardmask down to the surface of the silicon substrate 12. Then, the photoresist layer 22 is removed to complete the formation of a gate 24.

As shown in FIG. 3, a silicon nitride ($Si_3N_4$) 26 is deposited on the surface of the semiconductor wafer 10. As shown in FIG. 4, an anisotropic etching process is then used to form a spacer 28 on either side of the gate 24. Finally, an ion implantation process is performed, using the spacer 28 as a mask, to form a source 32 and drain 34 of the MOS transistor and complete the fabrication of the MOS transistor. The distance L between the source 32 and drain 34 is the channel length. The undoped polysilicon layer 20 comprising the gate 24 is implanted as a doped polysilicon layer during the ion implantation process performed for forming a source and a drain of each PMOS and NMOS transistor.

After performing the ion implantation process, an annealing process is performed to uniformly diffuse dopants in the undoped polysilicon layer 20 and to simultaneously drive dopants into the source 32 and drain 34. Gate depletion effects occur when the annealing process insufficiently drives the dopants down the entire depth of the gate 24. As shown in FIG. 5, a portion of the gate nearest the gate oxide layer 18 is depleted of dopants and behaves as an insulating region 30. As a result, the MOS transistor behaves as though the gate oxide layer 18 is substantially thicker, thereby resulting in signal delay of the gate and a substantial degradation in device performance.

Various techniques have been proposed to reduce gate depletion effects, the simplest method is to increase implantation dosage. However, because of the poly grain boundaries and the different dopant segregation at the poly/SiO2 interface, increasing the implant dose not necessarily increase the dopant concentration proportionally. Also, unless the gate oxide layer has good resistance to boron penetration, increasing the boron dose usually results in a boron penetration effect of a PMOS transistor.

SUMMARY OF THE INVENTION

It is therefore a primary objective of the present invention to provide a method for preventing gate depletion effects occurring in the MOS transistor to solve the above-mentioned problem.

In the preferred embodiment, the method is first forming a silicon oxide layer on the substrate of a semiconductor wafer. Then an amorphous silicon layer is formed on the silicon oxide layer followed by forming a silicon germanium ($Si_{1-x}Ge_x$, x=0.05~1.0) layer on the amorphous silicon layer. Thereafter, an etching process is performed to remove portions of the silicon germanium layer and the amorphous silicon layer to form a gate of the MOS transistor on the substrate. Finally, a spacer is formed around each gate and a source and a drain of each MOS transistor is formed in the substrate.

The present invention method uses a silicon germanium layer and an amorphous silicon layer as a gate conductive layer of the MOS transistor so as to increase active dopant concentration in the conductive layer and inhibit gate depletion effects.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
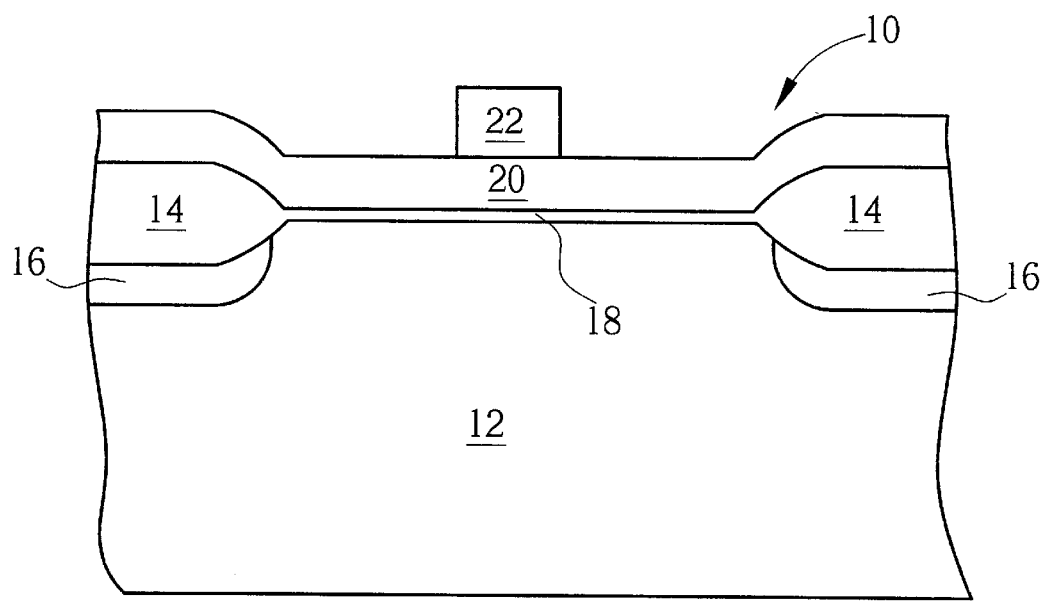
FIG. 1 to FIG. 4 are schematic diagrams of a method of fabricating a MOS transistor according to the prior art.
Figure 2:
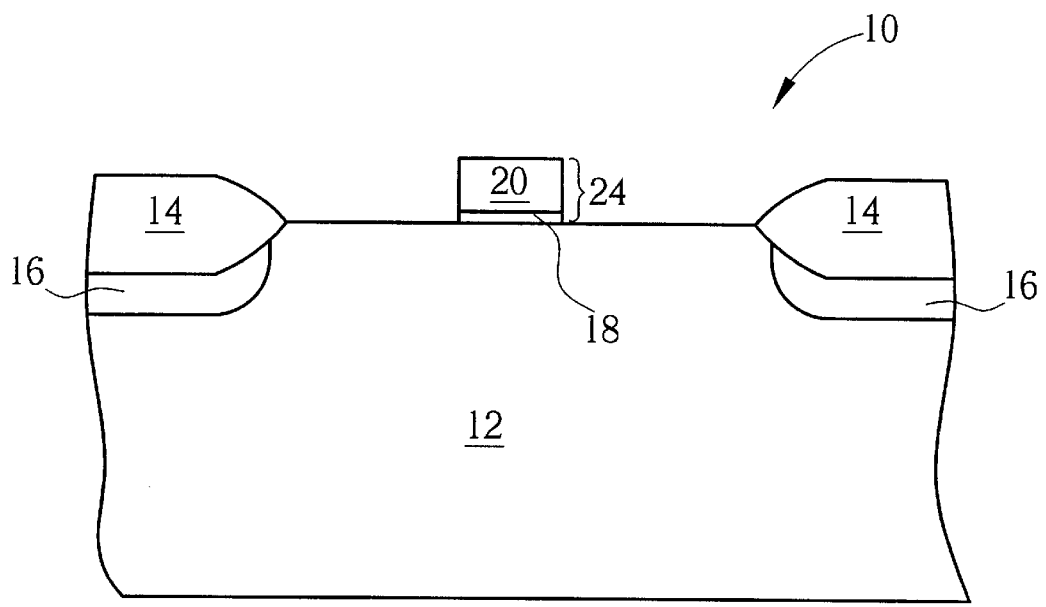
Figure 3:
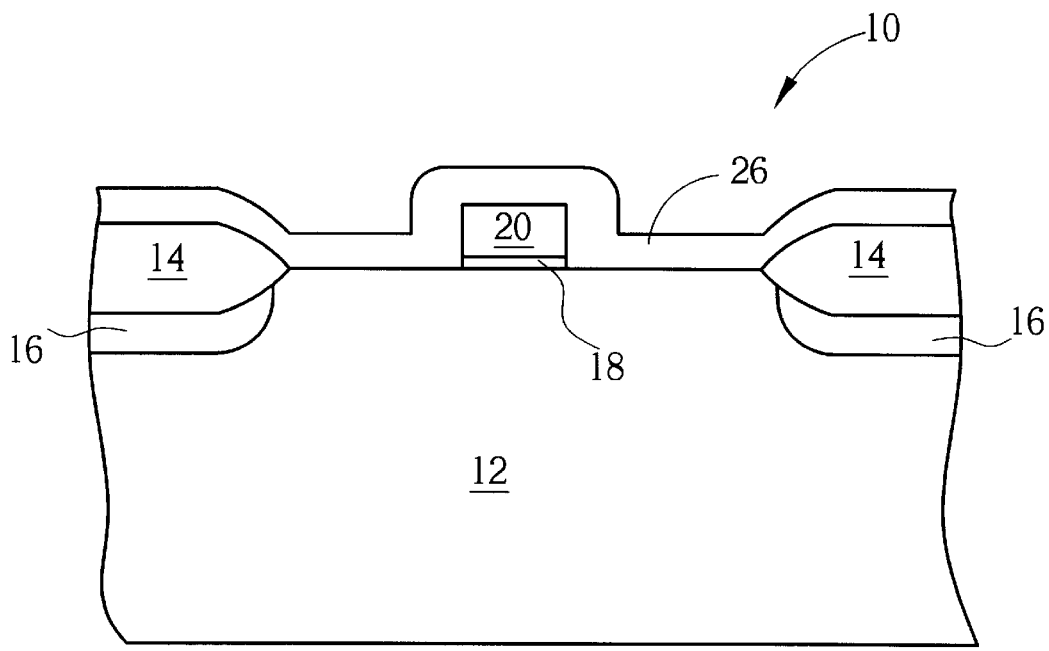
Figure 4:
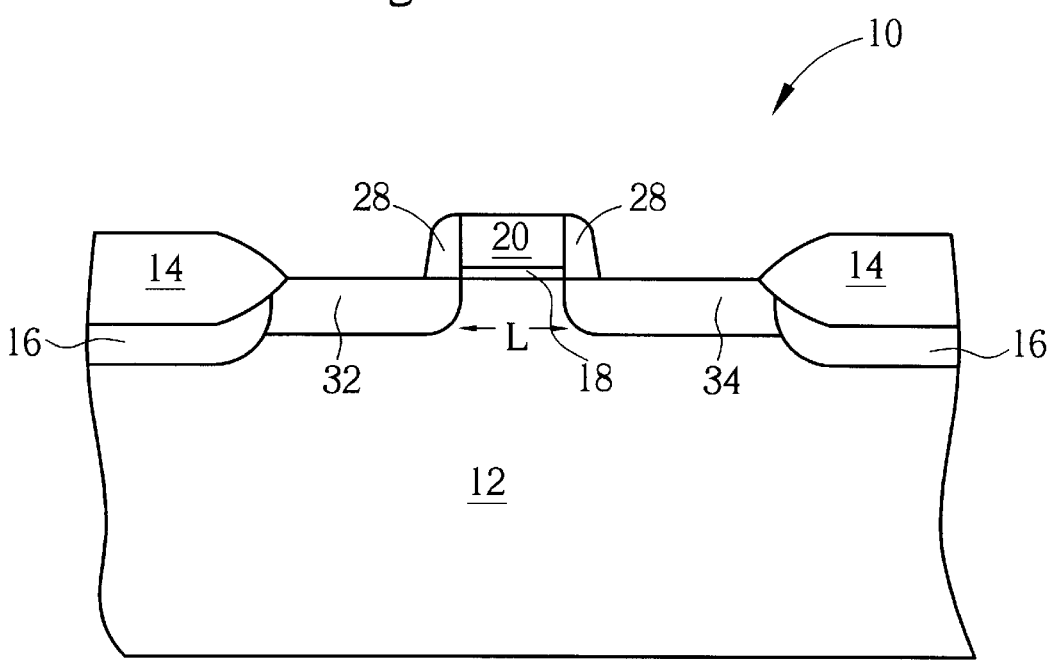
Figure 5:
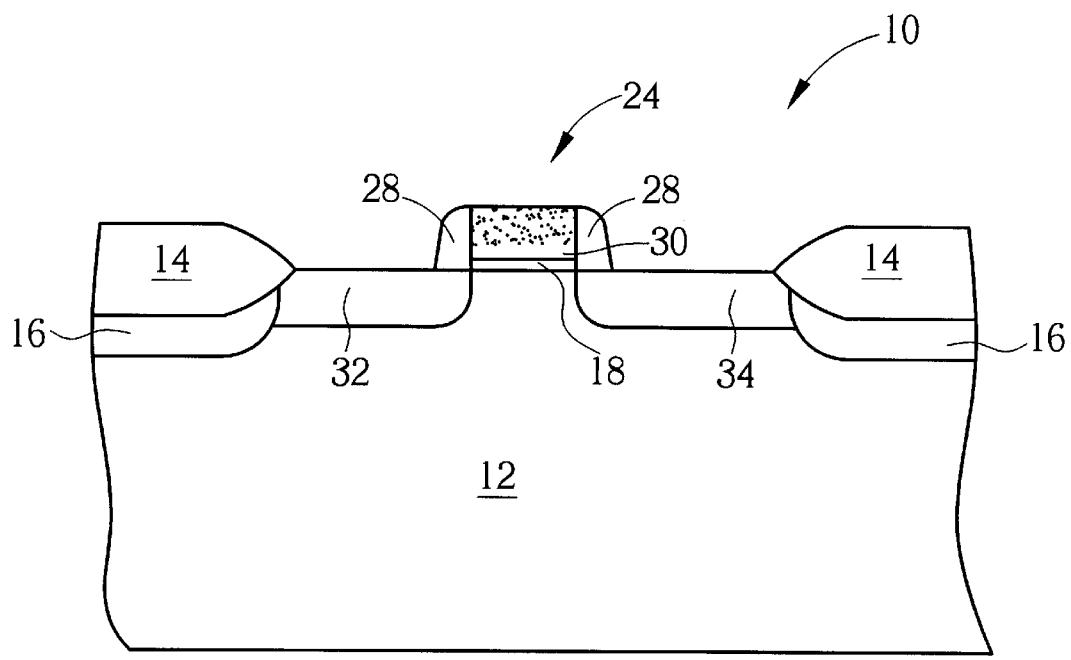
FIG. 5 is a schematic diagram of gate depletion effects occurring in the MOS transistor.
Figure 6:
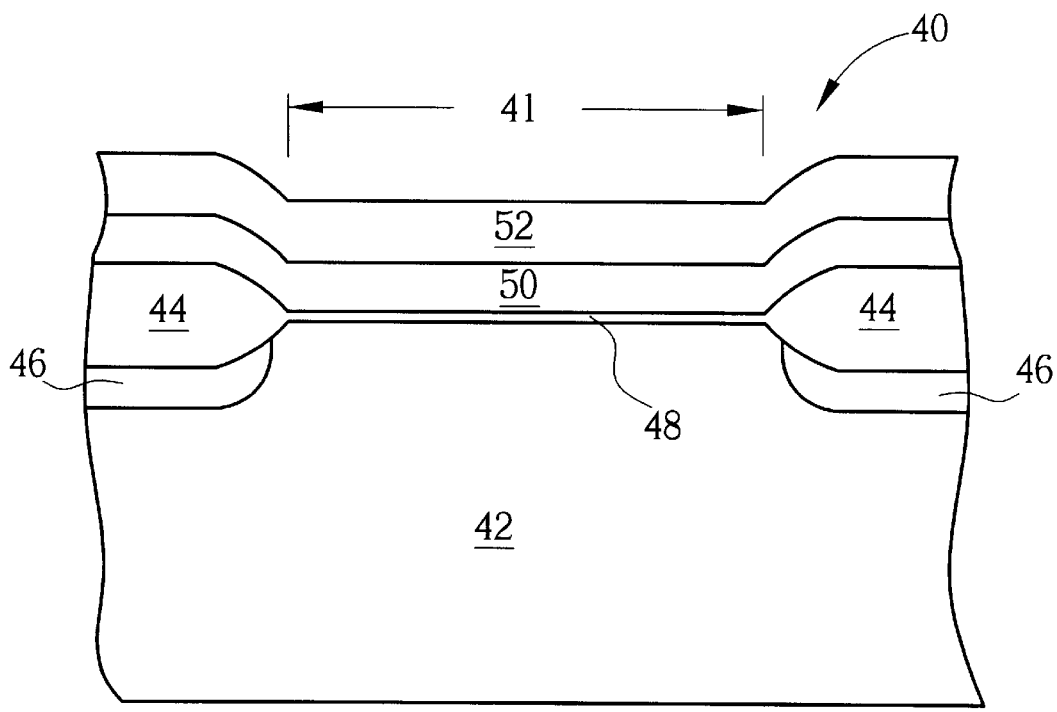
FIG. 6 to FIG. 8 are schematic diagrams of a method of fabricating a MOS transistor according to the present invention.
Figure 7:
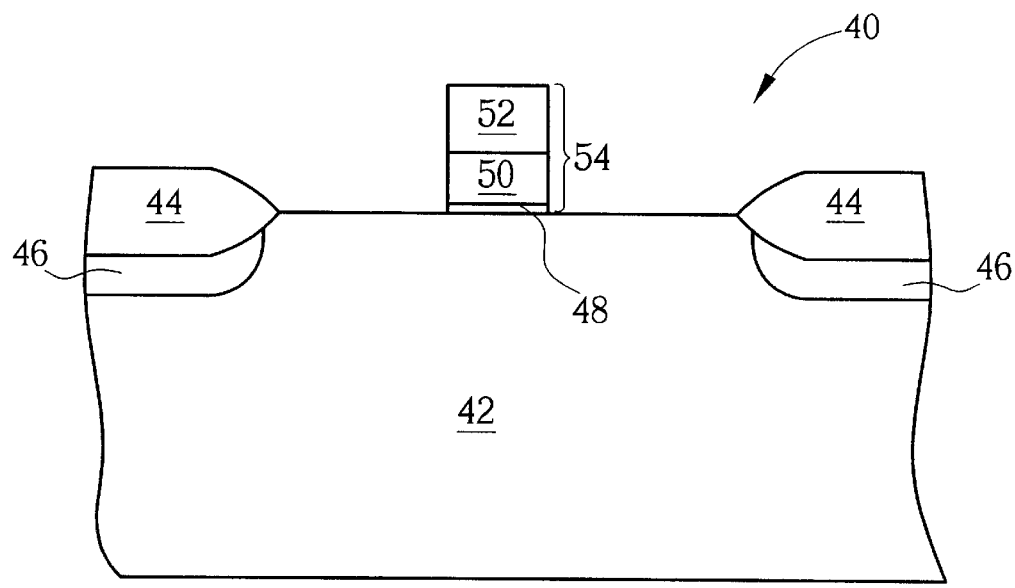
Figure 8:
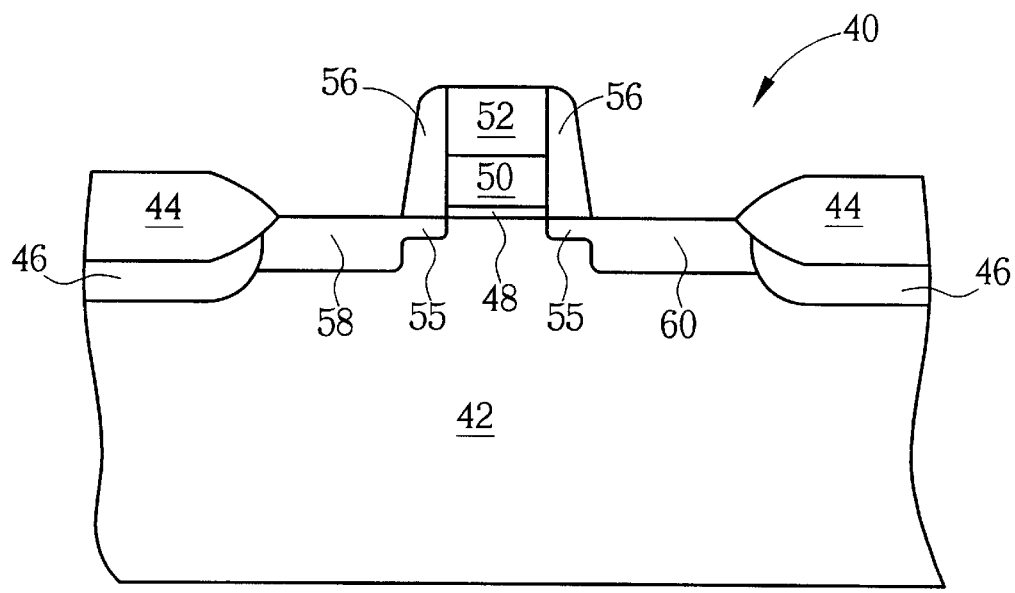

Please refer to FIG. 6 to FIG. 8 of schematic diagrams of fabricating a PMOS or an NMOS transistor according to the present invention. Additionally, the present invention is also applied to fabricate a nitride read only memory (NROM) device in a peripheral region. As shown in FIG. 6, a semiconductor wafer 40 comprises a silicon substrate 42 and plurality of both field oxides 44 and channel stops 46. The field oxide 44 functions only in isolating and defining the position of an active area 41. However, other isolation methods are also applicable to the present invention, whereby a shallow trench isolation (STI) structure can be used to replace the field oxide 44 of FIG. 6.

As shown in FIG. 6, the method of present invention first involves oxidizing the surface of silicon substrate 42 in the active area 41 to form a silicon oxide layer 48 with a thickness of 100–250 angstroms. The silicon oxide layer 48 is used as a gate oxide of the MOS transistor. Then an amorphous silicon layer 50 with a thickness of 700–1000 angstroms (Å) and a poly silicon germanium ($Si_{1-x}Ge_x$, x=0.05~1.0) layer 52 with a thickness of 1100~1500 angstroms (Å) are respectively formed on the surface of semiconductor wafer 40. Both the amorphous silicon layer 50 and poly silicon germanium layer 52 are used as a gate conductive layer. The silicon germanium layer 52 is formed by performing a chemical vapor deposition (CVD) process aerating silane ($SiH_4$), germane ($GeH_4$) and hydrogen at a temperature between 450° C. and 620° C.

As shown in FIG. 7, a patterned photoresist layer (not shown) is formed on the silicon germanium layer 52 to define patterns of gate. The patterned photoresist layer is used as a hard mask to perform an anisotropic etching process for removing the silicon germanium layer 52, the amorphous silicon layer 50 and the silicon oxide layer 48 not covered by the hard mask until the surface of the silicon substrate 42. Thereafter, the photoresist layer is removed to complete the process of fabricating a gate 54 structure.

Finally, as shown in FIG. 8, a first ion implantation process is first performed to form a lightly doped drain (LDD) 55 of the MOS transistor. Then a silicon nitride compound is deposited on the surface of the semiconductor wafer 40 followed by performing an anisotropic etching process to form a spacer 56 around the gate 54. Thereafter, the spacer 56 is used as a mask to perform a second ion plantation process so as to form two doped areas on two sides of the gate 54 on the silicon substrate 42. Then a high temperature annealing process is performed to drive the dopants into the two doped areas for forming a source 58 and a drain 60 of the MOS transistor. Thus far, the fabrication of MOS transistor is completed according to the present invention.

The MOS transistor according to the present invention uses a silicon germanium layer stack on an amorphous silicon layer as the gate conductive layer. As well, the high temperature annealing process performed after the formation of the source and drain diffuses germanium atoms in the silicon germanium layer into the amorphous silicon layer so as to transform the amorphous silicon layer to silicon germanium, furthermore, to suppress gate depletion effects occurring in the MOS transistor.

In contrast to the MOS transistor fabricated by the prior art, the MOS transistor according to the present invention uses a silicon germanium layer and an amorphous silicon layer as a gate conductive layer so as to increase active dopant concentration in the conductive layer and reduce signal delay caused by gate depletion effects. As well, the amorphous silicon layer will improve the quality of the gate oxide layer and increase the integrity of the oxide layer.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A MOS transistor fabricating method of preventing gate depletion effects occurring in the MOS transistor, the method comprising:

providing a semiconductor wafer;

forming a silicon oxide layer on the silicon substrate of the semiconductor wafer;

forming an amorphous silicon layer on the silicon oxide layer;

performing an in-situ doped chemical vapor deposition (CVD) process for forming a silicon germanium layer on the amorphous silicon layer;

performing an etching process to etch the silicon germanium layer and the amorphous silicon layer so as to form a gate of the transistor on the substrate;

forming a spacer around the gate;

performing a first ion implantation process to form two doped areas on two sides of the gate on the silicon substrate;

performing a high temperature annealing process to drive in the dopants in the two doped areas for forming a source and a drain of the MOS transistor; and diffusing germanium atoms in the silicon germanium layer into the amorphous silicon layer by the high temperature annealing process so as to transform the amorphous silicon layer to silicon germanium, furthermore, to suppress gate depletion effects occurring in the MOS transistor.

2. The method of claim 1 wherein the silicon oxide layer is used as a gate oxide of the MOS transistor.

3. The method of claim 1 wherein the chemical composition of the silicon germanium layer is $Si_{1-x}Ge_x$, x=0.05~1.0.

4. The method of claim 1 wherein the etching process also etches the silicon oxide layer.

5. The method of claim 1 wherein the amorphous silicon layer is used as a gate electrode of the MOS transistor.

6. The method of claim 1 wherein the MOS transistor is an n-type MOS transistor (NMOS), or a p-type MOS transistor (PMOS).

7. The method of claim 1 wherein a second ion implantation process is also comprised to form a lightly doped drain (LDD) of the MOS transistor.

8. The method of claim 1 wherein the reaction gases of the in-situ doped chemical vapor deposition (CVD) process comprise silane ($SiH_4$), germane ($GeH_4$) and hydrogen, and the deposition temperature of the in-situ doped CVD process is between 450° C. and 620° C.

* * * * *